US012622221B2

(12) United States Patent
Povazay et al.

(10) Patent No.: US 12,622,221 B2
(45) Date of Patent: May 5, 2026

(54) METHOD FOR THE SEPARATION OF STRUCTURES FROM A SUBSTRATE

(71) Applicant: EV Group E. Thallner GmbH, St. Florian am Inn (AT)

(72) Inventors: Boris Povazay, St. Florian am Inn (AT); Venkata Raghavendra Subrahmanya Sarma Mokkapati, St. Florian am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 380 days.

(21) Appl. No.: 18/033,896

(22) PCT Filed: Mar. 30, 2021

(86) PCT No.: PCT/EP2021/058318
§ 371 (c)(1),
(2) Date: Apr. 26, 2023

(87) PCT Pub. No.: WO2022/207083
PCT Pub. Date: Oct. 6, 2022

(65) Prior Publication Data
US 2023/0395418 A1     Dec. 7, 2023

(51) Int. Cl.
| | |
|---|---|
| *H01L 21/683* | (2006.01) |
| *H01L 21/02* | (2006.01) |
| *H01L 21/78* | (2006.01) |
| *H01L 33/00* | (2010.01) |
| *H10H 20/01* | (2025.01) |
| *H10P 72/70* | (2026.01) |
| *H10P 90/00* | (2026.01) |
| *H10P 95/00* | (2026.01) |

(52) U.S. Cl.
CPC ............. *H10P 72/74* (2026.01); *H10H 20/01* (2025.01); *H10P 90/00* (2026.01); *H10P 95/11* (2026.01); *H10P 72/7432* (2026.01); *H10P 72/7434* (2026.01); *H10P 72/744* (2026.01)

(58) Field of Classification Search
CPC ........... H01L 21/6835; H01L 21/02002; H01L 21/7806; H10H 20/01
See application file for complete search history.

(56) References Cited

U.S. PATENT DOCUMENTS

| | | | |
|---|---|---|---|
| 11,101,159 B1 * | 8/2021 | Brodoceanu | ...... H01L 21/67115 |
| 2005/0158904 A1 | 7/2005 | Hayashi et al. | |

(Continued)

FOREIGN PATENT DOCUMENTS

| | | |
|---|---|---|
| CA | 2936523 A1 | 1/2018 |
| JP | 2007221051 A | 8/2007 |
| KR | 20180086973 A | 8/2018 |

OTHER PUBLICATIONS

International Search Report from corresponding International Patent Application No. PCT/EP21/58318, dated Jan. 7, 2022.

(Continued)

*Primary Examiner* — Tracie Y Green
(74) *Attorney, Agent, or Firm* — RENNER, OTTO, BOISSELLE & SKLAR, LLP

(57) ABSTRACT

A method and a device for the separation of structures from a substrate. Furthermore, the invention relates to a method and a device for transferring structures from a first substrate to a second substrate.

14 Claims, 2 Drawing Sheets

(56) References Cited

U.S. PATENT DOCUMENTS

| 2006/0040468 | A1 | 2/2006 | Kelly et al. |
| 2013/0280885 | A1 | 10/2013 | Bayram et al. |
| 2015/0059411 | A1 | 3/2015 | Lim et al. |
| 2015/0372187 | A1* | 12/2015 | Bower ................ H01L 21/7806 |
| | | | 438/110 |
| 2019/0103507 | A1 | 4/2019 | Henley et al. |
| 2020/0367395 | A1* | 11/2020 | Liao ................... H05K 13/0486 |
| 2021/0111148 | A1* | 4/2021 | Chen ....................... H01L 24/81 |

OTHER PUBLICATIONS

Notification of Grounds for Rejection issued in corresponding Japanese Patent Application No. 2023-525623 dated Jan. 1, 20, 2025.

Last Notification of Rejection Reasons issued in related Japanese Patent Application No. 2023-525624 dated Jul. 25, 2025.

Office Action issued in Taiwan Patent Application No. 111108289 dated Jun. 27, 2025.

* cited by examiner

METHOD FOR THE SEPARATION OF STRUCTURES FROM A SUBSTRATE

FIELD OF INVENTION

The present invention relates to a method and a device for the separation of structures from a substrate. Furthermore, the invention relates to a method and a device for transferring structures from a first substrate to a second substrate. The structures to be separated from the substrate are in particular components split up into single units from a thin layer or the thin layer as such. The thin layer or the structures split up into single units have been produced in particular on the substrate, preferably grown on the substrate. The thin layer and the structures will thus be used synonymously in the following text. The structure to be separated is therefore disclosed in each case in connection with a structure split into single units or a thin layer.

BACKGROUND OF INVENTION

The prior art deals with the ablation of thin layers or structures split up into single units from a substrate with the aid of electromagnetic radiation. Thus, it is common for a laser to act on a boundary area in particular from a rear side of a substrate transparent for electromagnetic radiation, in order to bring about a detachment of the thin layer from this substrate. Radiation does not pass through the thin layer, but rather radiation takes place from the side of the substrate on which the thin layer is fixed. This process is referred to as the laser lift off (LLO) process in the prior art.

An LLO process is a contactless process wherein the thin to ultrathin layers can be separated from a substrate, in particular from a growth substrate. One of the prerequisites for a separation is that the substrate is transparent for the laser radiation used. Furthermore, provision is often made in the prior art such that an absorbing layer is provided between the substrate and the thin layer, so that the detachment takes place by the laser acting on the so-called detachment layer. The laser radiation is first passed from the rear side of the substrate through the substrate and then strikes the detachment layer or the thin layer. As a result of the interaction of the laser radiation with the absorbing layer, an ablation takes place through a physical and/or chemical reaction.

Photochemical, photothermal or combined separating processes for example are conceivable. It is also conceivable that the thin layer itself has a high absorption capacity for laser radiation and an absorbing layer is dispensed with. In this case, the processes take place in a boundary area or an interface of the substrate and the thin layer. Furthermore, plasma is very often used in order to improve the detachment of the thin layer from the substrate.

The adhesive forces between the substrate and the thin layer are markedly weakened by the aforementioned approach. In particular, a gas formation between the substrate and the thin layer contributes to a weakening of the adhesive forces. Gas arises primarily with the use of an additional absorbing layer between the substrate and the thin layer.

In the case of LLO processes, the transparency properties of the substrate and the absorption properties of the interface between the substrate and of the thin layer or the thin layer itself are typically used.

An example in the prior art is the gallium nitride/sapphire system. The very thin gallium nitride (GaN) layer is grown on a sapphire substrate. The ablation takes place with UV radiation. In this system, GaN absorbs the UV radiation used very intensively, whilst the sapphire substrate is very transparent in this wavelength region. Furthermore, the photo-chemical reaction $$2GaN \rightarrow 2GaN+N2$$

takes place, wherein nitrogen gas arises, which promotes the ablation by its volume expansion. The higher absorption and reflectivity of pure, metallic gallium, which arises through the chemical reaction at the interface, further supports the process.

The laser interaction of matter takes place in particular via the electrons. In rare cases, resonances permit a direct interaction with bound states. Laser radiation with an exact energy is required for this. Virtually free electrons in metals, i.e. electrons which are intensely subjected only to the prevailing potential, can be used as highly efficient broad-band absorbers, in order to absorb laser radiation. Epitaxially grown GaN layers have a band gap of 3.3 eV, whereas the band gap of sapphire lies at approx. 9.9 eV. For an LLO process with GaN on sapphire, a UV laser can for example be used in order to penetrate the sapphire substrate and to interact with the GaN or the GaN-sapphire interface.

Such thin layers, for example GaN layers, are usually produced on a growth substrate, which has a very low transmissivity for the electromagnetic radiation used, which is intended to be used for the ablation.

The growth substrate thus absorbs the electromagnetic radiation and the latter does not pass into the boundary area or reach the interface between the thin layer and the growth substrate, so that a separation of the thin layer is not readily possible by means of electromagnetic radiation.

A possible way of solving the problem would be to select a growth substrate which is transparent for electromagnetic radiation. However, growth substrates must be selected, on which the desired thin layers grow in the optimum manner. Consequently, for the separation of an, in particular, grown thin substrate from the growth substrate, there are limits with regard to the material of the substrate on which the thin layers or structures are provided.

A possible way of carrying out a separation of the thin layer from the growth substrate is to select electromagnetic radiation with a suitable frequency or wavelength, at which the transmissivity is sufficiently high to reach the interface between the thin layer and the growth substrate. The ablation capacity of the laser for the thin layer, however, largely depends on the frequency, so that an optimum choice of the frequency, which on the one hand permits a high transmissivity in respect of the substrate, and on the other hand permits a high ablation capacity, is very difficult. Furthermore, especially in the case of lasers, only electromagnetic radiation with a well-defined frequency is available, which cannot be arbitrarily varied or adjusted.

Nowadays, therefore, thin layers, such as for example GaN LEDs (GaN light emitting diodes), are produced or generated on small and expensive sapphire substrates. The latter permit an LLO process through the sapphire substrate from the rear side by means of UV laser radiation. For economic reasons, the generation of such thin layers (for example GaN layers) would make sense on more favourable silicon. Since silicon is however non-transparent in the UV wavelength region, UV lasers cannot be used to perform the GaN ablation. A detachment of a generated thin layer, in particular a GaN layer or a GaN structure, from a substrate by means of electromagnetic radiation is therefore complex.

In addition, there are limits on the selection of the material of the substrate and of the thin layer to be generated, since the separation of the thin layer is dependent on the degree of transmissivity of the material for electromagnetic radiation. A separation process by means of electromagnetic radiation that can be performed selectively is especially desired for the production of electronic components. The prior art is limited to specific materials for the growth substrates, which permit a separation of the structures by radiation through the growth substrate itself by means of electromagnetic radiation.

SUMMARY OF THE INVENTION

It is an object of the present invention, therefore, to specify a method and a device which at least partially remove, in particular completely remove, the drawbacks listed in the prior art. In particular, it is an object of the present invention to specify an improved method and a device for separating structures from a substrate. Furthermore, it is an object of the present invention to specify an alternative method and an alternative device for separating structures from a substrate. Furthermore, it is an object of the present invention to specify a method and a device which improve the transfer of structures from a transferring substrate to a receiving substrate.

The present problem is solved with the features of the coordinated claims. Advantageous developments of the invention are specified in the sub-claims. All combinations of at least two features specified in the description, in the claims and/or the drawings also fall within the scope of the invention. In stated value ranges, values lying within the stated limits should also be deemed to be disclosed as limiting values and can be claimed in any combination.

Accordingly, the invention relates to a method for separating structures from a substrate, comprising at least the following steps, in particular in the following sequence, i) provision of at least one structure on a first substrate, ii) irradiation of a boundary area between the first substrate and the at least one structure with electromagnetic radiation, iii) separation of the at least one structure from the first substrate, wherein the electromagnetic radiation first penetrates the at least one structure and then strikes the boundary area.

The beam path of the electromagnetic radiation thus runs from the source first to be substrates to be separated and only then strikes the boundary area. The boundary area or the interface lies in the region between the structures and the first substrate. If a further layer for the detachment (detachment layer) is arranged between the first substrate and the structures, the boundary area is, so to speak, formed by said detachment layer.

The thin layer is provided on the first substrate, especially a substrate surface. The thin layer can be generated on the first substrate. The thin layer is split up to form structures in optional further steps. The structures split up into single units are then in particular electronic components with a function. However, a structure can also be formed by a thin layer, so that, instead of a structure split up into single units, the entire thin layer can be separated. The thin layer thus also represents a structure.

In the method for the separation or the detachment of the structures, the electromagnetic radiation is not irradiated through the first substrate. On the contrary, the electromagnetic radiation is directed onto the at least one structure, wherein the at least one structure is at least partially permeable for the electromagnetic radiation. The at least one structure can thus advantageously be separated from the first substrate, without the radiation having to be passed through the first substrate to the boundary area. The method for the separation is thus more efficient, since no energy loss arises due to passing the electromagnetic radiation through the first substrate. Furthermore, the structures can be detached by the method from a first substrate which is made of a material which is impermeable for electromagnetic radiation. Furthermore, the first substrate can advantageously be preserved, since the electromagnetic radiation is absorbed only in the boundary area of the first substrate and is not irradiated through the first substrate. In this way, electromagnetic radiation in the UV region can advantageously be used. Furthermore, the at least one substrate to be separated is also preserved, since the latter is constituted essentially permeable for electromagnetic radiation. The separation can thus be carried out particularly free from defects. In addition, the electromagnetic radiation can advantageously take place from the side of the first substrate on which the structures are provided.

Furthermore, the invention relates to a device for separating structures from a substrate, at least comprising:

a first substrate with the least one structure which can be provided on the first substrate, irradiation means for irradiating a boundary area between the first substrate and the at least one structure with electromagnetic radiation and separation means for separating the at least one structure, wherein the irradiation means are constituted such that the electromagnetic radiation first penetrates the at least one structure and then strikes the boundary area.

The irradiation means are preferably lasers, which emit electromagnetic radiation of a specific wavelength. Depending on the materials used and the physical effect thus brought about for reducing the adhesive properties in the boundary area, the irradiation means can also be regarded as separation means. It is however also conceivable for the device also to comprise mechanical separation means for separating the structures from the first substrate. With the device for the separation of structures, a method for separating structures can be carried out particularly advantageously. The aforementioned advantages also apply in connection with the device for the separation of structures.

Furthermore, the invention relates to a method for transferring structures, in particular for transferring electronic components, from a first substrate to a second substrate, wherein the structures are separated from the first structure using the method for the separation of structures. The structures provided on the first substrate can be transferred particularly efficiently onto the second substrate. In addition, the first substrate is advantageously preserved and essentially absorbs electromagnetic radiation only in the boundary area.

Furthermore, the invention relates to a device for transferring structures, in particular for transferring electronic components, from the first substrate to a second substrate, wherein the structures provided on the first substrate can be separated from the first substrate using the device for the separation of substrates. The transfer of the structures can be carried out advantageously with the device in an efficient manner.

In another advantageous embodiment of the invention, provision is made such that the separation of the at least one structure takes place selectively. During the irradiation of the boundary area with electromagnetic radiation, the latter can advantageously be introduced locally limited to the corresponding boundary area of the at least one structure. The first substrate, therefore, will absorb the electromagnetic radiation only in the boundary area of the structure. The method thus preserves the first substrate, since the electromagnetic radiation is introduced only in selected areas of the boundary area. Furthermore, a separation of individual structures provided on the first substrate can take place selectively, so that a broader field of application is enabled for the method for the separation. For example, defective structures can selectively not be separated from the first substrate or only specific structures with specific properties can be detached selectively from the first substrate.

In another advantageous embodiment of the invention, provision is made such that the at least one structure has a thickness between 0 μm and 1000 μm, preferably between 0 μm and 500 μm, still more preferably between 0 μm and 200 μm, most preferably between 0 μm and 150 μm, with utmost preference between 0 μm and 100 μm. The thin layer or structure can thus be particularly well preserved and efficiently irradiated with electromagnetic radiation.

In another advantageous embodiment of the invention, provision is made such that the at least one structure is generated, preferably grown, on the first substrate before the separation from the first substrate. In other words, the first substrate is preferably a growth substrate on which the thin layer or the structures split up into single units are directly produced, preferably grown. Furthermore, it is conceivable that a growth layer is applied on the first substrate, on which the thin layer or the structures are generated and thus provided for the method for the separation. In particular, the growth layer can also act at the same time as a detachment layer. If the thin layer or the at least one structure is generated on the substrate, the latter can advantageously be separated from the first substrate with the method for separation, without the first substrate having to the constituted permeable for electromagnetic radiation.

In another advantageous embodiment of the invention, provision is made such that, during the irradiation in step ii), irradiation means emit electromagnetic radiation and are directed onto the at least one structure. The irradiation means are preferably lasers. They are particularly preferably pulsed and focused, so that electromagnetic radiation can advantageously be introduced locally. The electromagnetic radiation passes through the at least one structure and is practically not absorbed by the latter. The irradiation means are directed onto the at least one structure. It is conceivable, however, for further layers and other elements to be penetrated by the electromagnetic radiation, before the latter first strikes the at least one structure and then strikes the boundary area. For example, coatings can be applied on a side of the structures facing away from the first substrate, so that the separated structures are able to be applied or fixed on another surface.

In another advantageous embodiment of the invention, provision is made such that the first substrate is silicon. The first substrate is thus essentially made of silicon. It has surprisingly been shown that structures can be particularly easily and efficiently separated from substrates on a silicon base with the method for separation.

In another advantageous embodiment of the invention, provision is made such that the at least one structure is made of gallium nitride (GaN). The method is particularly preferred for the separation of thin layers or structures of gallium nitride. It has surprisingly been shown that the method for separation by means of electromagnetic radiation, in particular in the UV region, can be carried out particularly efficiently and easily with the structures made of gallium nitride. Depending on the wavelength of the electromagnetic radiation, the at least one structure of gallium nitride can be separated in a particularly preserved manner from the first substrate. The electromagnetic radiation is for the most part not absorbed when it penetrates the structures of GaN, so that the method for separation is predestined for structures of gallium nitride.

In another advantageous embodiment of the invention, provision is made such that a wavelength of the electromagnetic radiation lies between 300 nm and 2000 nm, preferably between 310 nm and 1800 nm, still more preferably between 320 nm and 1600 nm, most preferably between 340 nm and 1400 nm, with utmost preference between 370 nm and 1250 nm. The method can be carried out particularly efficiently in the region of these wavelengths. Particularly preferably, the wavelength is adapted to the material of the structures or of the thin layers, so that the latter as far as possible to not absorb the electromagnetic radiation. By the use of short-wave electromagnetic radiation, in particular UV radiation, penetration of the electromagnetic radiation into the first substrate can be limited to be boundary area. The first substrate, which is preferably a growth substrate, is thus advantageously preserved. Furthermore, by using shortwave electromagnetic radiation, in particular UV radiation, in particular pulse times in the pico- to nanosecond range, a plasma generation can be promoted in the interface. A particularly defect-free and preserving separation of the structures is thus enabled.

In another advantageous embodiment of the invention, provision is made such that a transmissivity of the at least one structure for electromagnetic radiation is greater than 10%, preferably greater than 25%, still more preferably greater than 50%, most preferably greater than 75%, with utmost preference greater than 90%. The at least one structure or the thin layer is heated as little as possible, so that faults on account of heat or radiation input in the structure are reduced.

In another advantageous embodiment of the invention, provision is made such that the transmissivity of the first substrate for electromagnetic radiation is less than 90%, preferably less than 75%, still more preferably less than 50%, most preferably less than 25%, with utmost preference less than 10%. In this way, the boundary area can be advantageously influenced locally. A penetration of electromagnetic radiation into the first substrate can advantageously be prevented, so that the first substrate is preserved and consequently can more frequently be used for providing or for generating the structures.

In another advantageous embodiment of the invention, provision is made such that an intensity of the electromagnetic radiation lies between 100 mWatt and 10 kWatt, preferably between 1 Watt and 1 kWatt, still more preferably between 5 Watt and 500 Watt, most preferably between 7 Watt and 250 Watt, with utmost preference between 10 Watt and 100 Watt. Surprisingly, it has been shown that the energy input for these ranges is at an optimum for performing the method for separating structures.

In another advantageous embodiment of the invention, provision is made such that the second substrate is transparent for electromagnetic radiation and is arranged between the irradiation means and the at least one structure during the irradiation in step ii). A method for the transfer can be carried out particularly efficiently, if the second substrate is constituted largely transparent for electromagnetic radiation. In this way, the irradiation means can for example be arranged advantageously in a space-saving manner on the side of the second substrate facing away from the first substrate. In addition, in the irradiation process, not only a separation of the structures can be carried out by the same irradiation means, but also a transfer of the structures onto the second substrate can take place.

It is an aspect of the invention, therefore, to focus electromagnetic radiation, in particular laser radiation, through the thin layer or through the structure, onto the boundary area or the interface. It is thus possible to dispense with the irradiation through the substrate, which very often is non-transparent for the electromagnetic radiation to be used. The ablation or the separation of the thin layer is thus possible from the side lying opposite the substrate. Furthermore, there is no unnecessary limit in the material selection for the growth substrate when the separation is carried out with the proposed method.

This takes place in particular by selecting an irradiation direction in which the electromagnetic radiation, in particular laser radiation, is radiated through the thin layer to be detached, in order to reach the boundary area or the interface between the structure to be separated and the substrate. The laser radiation thus reaches the interface not as in the prior art through the substrate, but rather through the thin layer or the structure.

The method thus enables a separation of the structures without the rear side of the substrate having to be accessible. Furthermore, more cost-effective production of grown or generated thin layers or structures (e.g. GaN-based power components) is thus enabled, since the latter can also be produced on non-transparent substrates.

For example, silicon substrates have a small band gap, so that electromagnetic radiation in the UV and the visible wavelength region is absorbed. For this reason, lasers with a wavelength in the infrared region are required for the ablation in the prior art.

In the proposed method for the separation of substrates, in particular for GaN, a thin layer is located on a substrate with high absorption in the wavelength region of the electromagnetic radiation used. For this reason, the thin layer must be at least partially transparent for the employed electromagnetic radiation, which is used for the ablation of the thin layer. GaN with a band gap of approx. 3.3 eV is transparent in the UV wavelength region. A GaN layer/structure on silicon is thus irradiated with electromagnetic radiation first and is penetrated by the latter. The silicon lying beneath then absorbs the electromagnetic radiation in the boundary area. The absorption then leads to the ablation of the thin layer or the structure.

GaN is decomposed thermally to form pure, metallic gallium and nitrogen gas between approx. 710° C. and 980° C. This temperature can be reached locally by laser radiation, in particular when a plasma is also produced in the interface by the laser radiation. A short pulse duration can limit the heating effect locally. Furthermore, the dissociation can be influenced by doping of the substrate.

The method advantageously permits the use of an arbitrary substrate, in particular growth substrate, for generating the thin layer. In particular, the use of silicon as a growth substrate is enabled, which represents a more favourable alternative to sapphire substrates. The thin layers can thus be produced on non-transparent substrates, which are less expensive, more readily available, larger or more powerful.

The ablation can advantageously be carried out with electromagnetic radiation which is at higher frequencies. In addition, a selective separation of individual structures or layer areas is enabled.

Furthermore, electromagnetic radiation can be used which, whilst penetrating the thin layer, heats the latter only insignificantly. The thin layer or the structure generated from it is therefore subjected to less of a negative impact.

Damage to the growth substrate is minimised and reduced particularly advantageously by the sequence of the radiation penetration, since radiation does not pass through the growth substrate, but when the radiation is absorbed only in the boundary area.

The proposed method can also be used advantageously for other materials or other thin layers on other first substrates/growth substrates, as long as electromagnetic radiation can be generated which penetrates the thin layer and is absorbed by the growth substrate.

The growth substrate and an optional second (transfer or product) substrate, onto which the thin layer or the structures are transferred, are damaged less and can thus be used more frequently.

The method thus describes a new possible way of separating a thin layer or structures, which are generated from this thin layer, from a first substrate. Since the structures also emerge from a thin layer, and are only split up into single units by further process steps, mention will preferably only be made, for the sake of simplicity, of structures in the subsequent text. Structure and thin layer can be used synonymously, even if the structure can be constituted as an element comprising more than the thin layer.

The thin layer is preferably produced, in particular grown, directly on the first substrate. The first substrate can thus also be referred to as the growth substrate.

The pulse times of the electromagnetic radiation preferably lie between 1.0 picoseconds and 100 picoseconds, preferably between 2.0 picoseconds and 75 picoseconds, still more preferably between 3.0 picoseconds and 50 picoseconds, most preferably between 4.0 picoseconds and 25 picoseconds, with utmost preference at approximately 5 picoseconds.

Pulses in the picosecond range are thus also preferable, because still shorter pulses in the range of femtoseconds produce non-linear effects, which may be disadvantageous for the method. Furthermore, thermal diffusion is for the most part prevented by a short-pulsed action of the electromagnetic radiation.

The frequency of the pulse rate is understood to mean the number of pulses of electromagnetic radiation which are emitted per second. The frequency of the pulse rate lies between 10 kHz and 1000 kHz, preferably between 50 kHz and 900 kHz, still more preferably between 100 kHz and 800 kHz, most preferably between 250 kHz and 700 kHz, with utmost preference at approximately 500 kHz.

It has also been shown that an ideal energy surface density of the electromagnetic radiation lies at approximately 10 $\mu$J/25 $\mu$m$^2$, which corresponds to $4*10^5$ J/m$^2$. The energy surface density thus lies particular preferably between $10^2$ J/m$^2$ and $10^8$ J/m$^2$, preferably between 103 J/m$^2$ and 107 J/m$^2$, most preferably between $10^4$ J/m$^2$ and $10^5$ J/m$^2$, with utmost preference at approximately $4*10^5$ J/m$^2$.

The thin layer has a thickness between 0 $\mu$m and 1000 $\mu$m, preferably between 0 $\mu$m and 500 $\mu$m, still more preferably between 0 $\mu$m and 200 $\mu$m, most preferably between 0 $\mu$m and 150 $\mu$m, with utmost preference between 0 $\mu$m and 100 $\mu$m. Accordingly, the structures split up into single units preferably have the same thickness.

In an embodiment, an absorption layer is located on the growth substrate and is intended to absorb the electromagnetic radiation. In this case, the thin layer to be separated subsequently is produced, in particular grown, on the absorption layer. The absorption layer is preferably very thin and has a maximum absorption capacity for electromagnetic radiation of the subsequently described separation process. The boundary area is thus formed, so to speak, by the absorption layer arranged between the first substrate and the thin layer, a boundary area which absorbs electromagnetic radiation and defines the location of the separation between the first substrate and the thin layer or structure. The absorption layer preferably has the same crystallographic orientation as the first substrate.

In a very particularly preferred variant of the embodiment, the crystal systems and grid system of the absorption layer and of the first substrate are identical. In a likewise preferred embodiment, the grid parameters of the absorption layer and the first substrate are identical.

The absorption layer can thus serve as a growth layer for the thin layer to be generated. This is particularly advantageous when this (absorption) layer has the optimum properties for serving as a growth layer and as an absorption layer.

The boundary area or interface is understood to mean the area at which the thin layer or structure to be separated have to be separated. If the thin layer has been grown directly on the first substrate, the boundary area is between the thin layer and the first substrate. If the thin layer has been grown on an absorption layer, the boundary area is between the thin layer and the absorption layer.

The absorption layer has a thickness between 0 μm and 100 μm, preferably between 0 μm and 50 μm, still more preferably between 0 μm and 20 μm, most preferably between 0 μm and 10 μm, with utmost preference between 0 μm and 1 μm.

The materials on both sides of the interface can be adapted in such a way that the absorption and/or outgassing is improved. For example, it is conceivable that, in the substrate surface of the first substrate, the growth substrate, and/or the thin layer itself, one or more elements are implanted which, when exposed to electromagnetic radiation, exit in particular as gas and assist the ablation. It is also conceivable that, in the substrate surface of the first substrate, the growth substrate, elements are implanted which enable a particularly efficient absorption of electromagnetic radiation, which leads to better heating of the first substrate. In this case, the use of an absorption layer, for example, can be completely dispensed and the thin layer can be produced directly on the substrate, the growth substrate.

The method is preferably carried out with electromagnetic radiation with a specific frequency, intensity and coherence. In principle, any electromagnetic radiation which can penetrate the thin layer and leads to ablation of the thin layer from the substrate can be used. In the following text, laser radiation will be used by way of example for electromagnetic radiation.

The electromagnetic radiation used has a wavelength or has a frequency which does not lead to undesired absorption phenomena in the thin layer. The wavelength lies between 1000 μm and 10 nm, preferably between 500 μm and 25 nm, still more preferably between 250 μm and 50 nm, most preferably between 100 μm and 75 nm, with utmost preference between 10 μm and 100 nm.

For the special case of grown GaN on silicon, the preferred wavelength ranges are as follows. The wavelength lies between 300 nm and 2000 nm, preferably between 310 nm and 1800 nm, still more preferably between 320 nm and 1600 nm, most preferably between 340 nm and 1400 nm, with utmost preference between 317 nm and 1250 nm.

Electromagnetic radiation in this wavelength region thus penetrates the GaN very well and is absorbed sufficiently well by the silicon. Accordingly, in the case of a method for the transfer of the structures onto a second substrate, the second substrate onto which the GaN is transferred should be transparent for this wavelength. The second substrate can thus preferably receive GaN structures/layers and has a sufficiently good transmissivity in the wavelength range used. The second substrate is preferably made of the sapphire.

The thicknesses of the two substrates lies between 0 μm and 2000 μm, preferably between 100 μm and 1500 μm, still more preferably between 200 μm and 1300 μm, most preferably between 300 μm and 1200 μm, with utmost preference between 500 μm and 1000 μm. Since the first substrate serves for the growth and the second substrate for the fixing after the ablation, greater thicknesses are preferred, since greater thicknesses make the two substrates sufficiently stable.

A relative movement can be made between the substrate and the source of the electromagnetic radiation. In a particularly preferred embodiment, all the optical components are static, whereas the substrate fixed on the substrate holder moves. The substrate holder is then designed such that the electromagnetic radiation can be focused on the interface between the first substrate and the thin layer. The relative movement takes place in a meandering and/or linear and/or rotational manner. This kind of relative movement, with which an area along a path is scanned, is sometimes also called scanning.

In a particular embodiment, the separation of the thin layer or the structures which are produced from the thin layer from the first substrate can be assisted by mechanical separation processes.

In contrast with the prior art, in which the laser radiation in the infrared region is predominantly used, laser radiation from a higher frequency range can be used in the improved method. The laser radiation from the UV region is preferably used.

For some applications such as micro (p)-LED transfers, the GaN can be pre-structured on a carrier. For economic reasons, the number of LEDs per carrier should be as large as possible. Technically, however, it is necessary to detach the LEDs separately from the carrier in order to be able to combine them with other components. The detachment or separation of the substrates can advantageously take place selectively.

The method for transferring components can also be used for non-structured, in particular epitaxial (thin) layers. In this case, the thin and grown layer is separated from the first substrate.

Individual areas can be separated selectively or the electromagnetic radiation can be introduced over the entire area in the boundary area.

The method for transferring components can be used in respect of a multiplicity of layers and structures. However, the transfer of GaN-based structures, e.g. such as p-LEDs, power components or pure thin GaN layers is preferred. The structures preferably grown and split up into single units on the first substrate are transferred onto a second substrate, whereby electromagnetic radiation, in particular a laser, penetrates through the structures and brings about an ablation at the interface of the structure in order to separate the structure from the first substrate.

Important aspects and advantages of the method for the separation of structures are for example that:

the first substrate or an absorption layer absorbs the electromagnetic radiation and leads to an, in particular, defect-free ablation of the structure, the electromagnetic radiation is introduced pulsed and focused, i.e. locally, the electromagnetic radiation, in contrast with the prior art, acts on the interface not through the first substrate, the growth substrate, but through the structure, by using shortwave electromagnetic radiation, in particular UV radiation, penetration of the electromagnetic radiation into the first substrate, the growth substrate, is prevented, which leads to preservation of the growth substrate, by using shortwave electromagnetic radiation, in particular UV radiation, in particular by means of pulse times in the pico- to nanosecond region, the plasma generation in the interface is promoted, which leads to a better ablation and as a result of the change in the substrate surface of the first substrate, the absorption and/or an outgassing process can be improved.

In the following table, three possible systems are represented, with which the method according to the invention for the separation of structures can be carried out.

|  | System 1 | System 2 | System 3 |
|---|---|---|---|
| First substrate/growth substrate | Silicon | Silicon | Sapphire or silicon |
| Structure/thin layer | GaN | GaAs | InGaAs |
| Second substrate | Glass | Glass | Glass |
| Wavelength range | 0.4 μm-1.1 μm | 0.95 μm-10 μm | 1.00 μm-2.4 μm (dependent on the As concentration) |
| Laser | Titanium Sapphire laser | Yb-YAG laser Ho-YAG laser Er-YAG laser Er-glass laser Nd-glass laser | Yb-YAG laser Ho-YAG laser Er-YAG laser Er-glass laser Nd-glass laser |

These systems are predestined for the method according to the invention. Further systems and/or combinations of the latter are however also conceivable for carrying out the method according to the invention. Each system comprises the materials for the first substrate, which serves as the growth substrate, for the structures or a thin layer, as all as a preferred second substrate, onto which the structures or the thin layer are to be transferred. Furthermore, possible wavelength ranges are stated and the lasers whose photon wavelength lies in this wavelength range. The person skilled in the art generally knows a number of lasers for the stated wavelength range.

Further advantages, features and details of the invention emerge from the following description of preferred examples of embodiment and with the aid of the drawings.

BRIEF DESCRIPTION OF DRAWINGS

Identical components or components with the same function are denoted by the same reference numbers in the figures.

DETAILED DESCRIPTION OF INVENTION

Figures 1A, 1B, 1C, 1D, 1E, 1F:
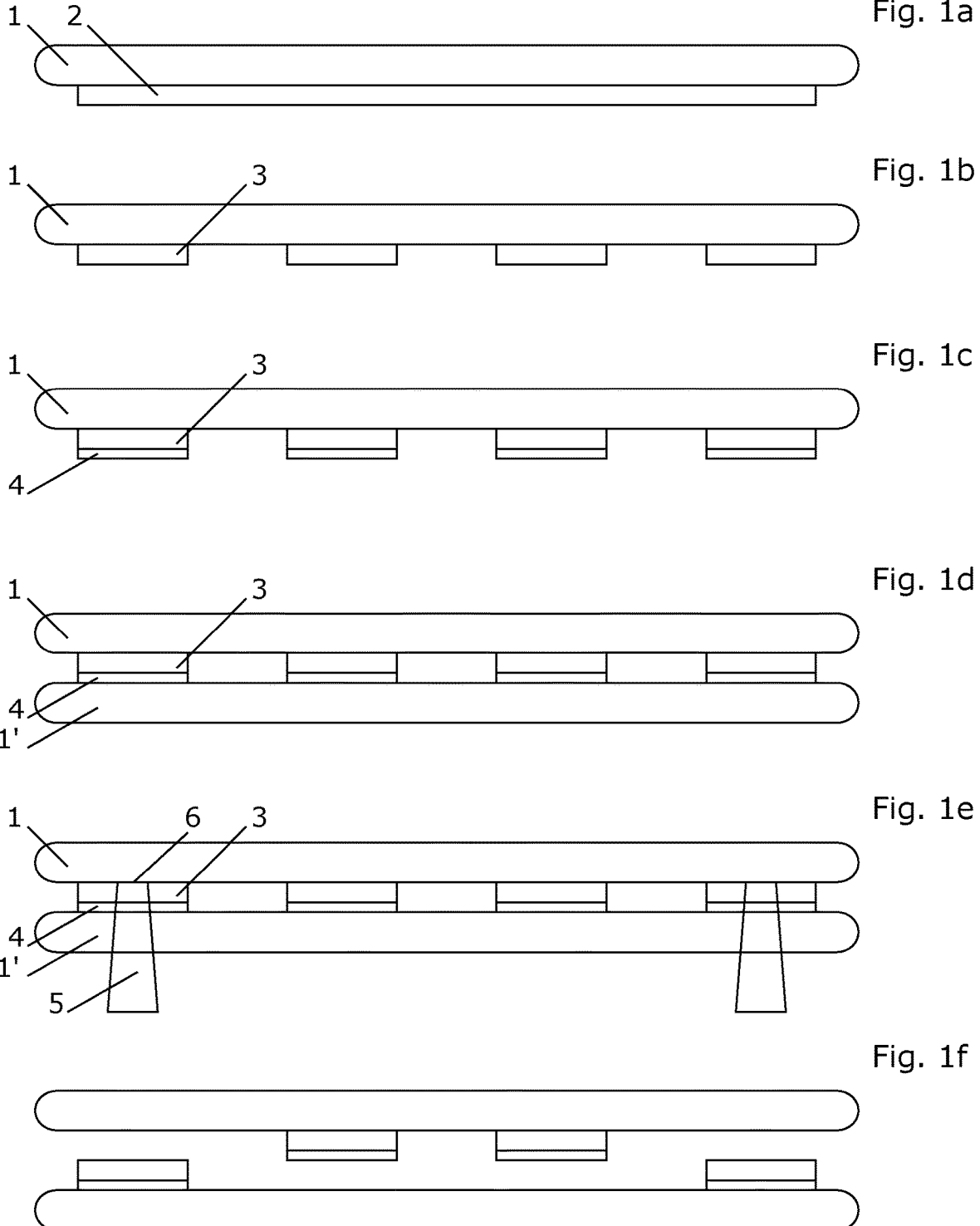
FIG. 1a shows a first process step of an exemplary method according to the invention.
FIG. 1b shows a second process step of an exemplary method according to the invention.
FIG. 1c shows a third process step of an exemplary method according to the invention.
FIG. 1d shows a fourth process step of an exemplary method according to the invention.
FIG. 1e shows a fifth process step of an exemplary method according to the invention.
FIG. 1f shows a sixth process step of an exemplary method according to the invention.

An embodiment of an exemplary method according to the invention is shown in the following figures. A thin layer 2 is generated directly on a first substrate 1, a growth substrate. Thin layer 2 is either structure 2 to be separated or is split up in an optional step into a plurality of structures 3, which can be detached in particular separately and selectively. The representation of an absorption layer, which can in particular serve at the same time as a growth layer and which is located on the first substrate, is dispensed with here. In the case of an absorption layer, the absorption of electromagnetic radiation 5 then takes place not primarily at first substrate 1, but primarily at the absorption layer. Interface 6 is then the interface between thin layer 2 and the absorption layer. Substrate 1 and/or the absorption layer are predominantly, preferably completely, constituted impermeable for the irradiation means.

FIG. 1a shows a first process step, in which a thin layer 2 has been generated on a first substrate 1. Thin layer 2 can be generated by any method, for example by PVD or CVD processes. Thin layer 2 is preferably an epitaxial layer. Substrate 1 is therefore suitable for allowing desired thin layer 2 to grow of a surface. In particular, the crystallographic orientation, the grid parameters and the material of substrate 1 should be selected such that thin layer 2 can grow in the optimum manner, in particular epitaxially, monocrystalline and preferably as free from defects as possible. The possible selections for a suitable substrate 1 for providing desired thin layer 2 are limited by these conditions. However, it is advantageously not necessary for substrate 1 to be constituted permeable for the irradiation means.

FIG. 1b shows an optional second process step, in which thin layer 2 is split up into single units. In order to split up thin layer 2 into single units, a number of process steps are generally required. It would also be conceivable for this process step not to take place, in which case the entire thin layer 2 is transferred and forms structure 2 to be transferred. As a result of splitting up thin layer 2 into single units, a plurality of structures 3 split up into single units arises, which are referred to as components, since they usually have a functionality. It would be conceivable, for example, for LEDs to be created from structures 3. The specialist in the field knows which components can be produced.

FIG. 1c shows an optional third process step, in which structures 3 are coated, in particular oxidised. Coating 4 can also take place before the second step of splitting-up into single units according to FIG. 1b. Coating 4 can have any purpose, but is preferably used to improve the bond during the transfer of structures 3 onto a second substrate 1'. In particular, an oxide layer can improve the bond between structures 3 and second substrate 1'.

FIG. 1d shows a fourth process step, in which contacting, a so-called bond, between structures 3 of first substrate 1 and a second substrate 1' takes place. The two substrates 1 and 1' are preferably previously aligned with one another. It is also conceivable for substrate 3 to be aligned relative to alignment marks on second substrate 1'. It is also conceivable for a heat treatment to be carried out after the contacting, in order to improve the bond between structures 3 and second substrate 1'. Second substrate 1' is transparent for electromagnetic radiation 5 used in the next process step.

FIG. 1e shows a fifth process step, in which the irradiation means radiate a specific electromagnetic radiation 5 through structures 3 onto an interface between structures 3 and first substrate 1'. Interface 6 between first substrate 1 and structures 3 is irradiated with the aid of electromagnetic radiation 5, in particular a laser. According to the invention, electromagnetic radiation 5 radiates through structures 3. Second substrate 1' used can always be selected such that it is transparent for the electromagnetic radiation used in each case. The electromagnetic radiation is not therefore radiated through first substrate 1, which must meet very specific requirements as the growth substrate, onto interface 6, but rather penetrates second substrate 1' which can be selected relatively freely with respect to its physical properties, as well as a possible coating 4 and structure 3.

A coating 4 that is present is as a rule very thin, so that it brings about a high absorption of the electromagnetic radiation only in the rarest cases. Furthermore, in most cases coating 4 is in any case an oxide, which is permeable in a broad wavelength range. In the figure, the exposure of two structures 3 is represented, in order to illustrate the selectivity options with the process. Structures 3 can be detached and transferred individually, as required. Electromagnetic radiation 5 used is preferably pulsed. The pulsed energy leads to an ablation of structure 3 from first substrate 1 along interface 6.

The ablation can take place by different chemical and/or physical effects. It is conceivable, for example, that the thermal expansions of the materials of structure 3 and first substrate 1 are different. This leads to a difference in thermal expansion and therefore to thermal stresses. The thermal stresses ultimately lead to the ablation. It is also conceivable for a gas to arise in interface 6. Especially when structures 3 have been produced from a material which comprises nitrogen, carbon or hydrogen, the formation of nitrogen gas, carbon dioxide, carbon monoxide, hydrogen gas, with the presence of oxides in the vicinity also water, can lead to an ablation along interface 6, since the formed gases and/or liquids bring about an increase in pressure due to the expansion of their volume, which leads to an ablation of structure 3 from first substrate 1. The generation of a plasma in interface 6, which still further improves the ablation, is also conceivable.

FIG. 1f shows a sixth process step, in which two structures 3 are located on second substrate 1', whilst all the other structures 3 remain on first structure 1. It would of course also be conceivable for substrate 1' also to have other structures (not represented) and for transferred structures 3 not to be transferred directly onto substrate surface 1o' of second substrate 1', but rather onto the structures (not represented) already present on second substrate 1'. In this case, it would be an easy matter to produce, in particular, a plurality of stacks of structures 3 on a second substrate 1'. Employed electromagnetic radiation 5 arriving at interface 6 and passing through a stack of structures is possibly weaker due to a plurality of structures 3 arranged one above the other. The irradiation means must be designed accordingly.

Figure 2:
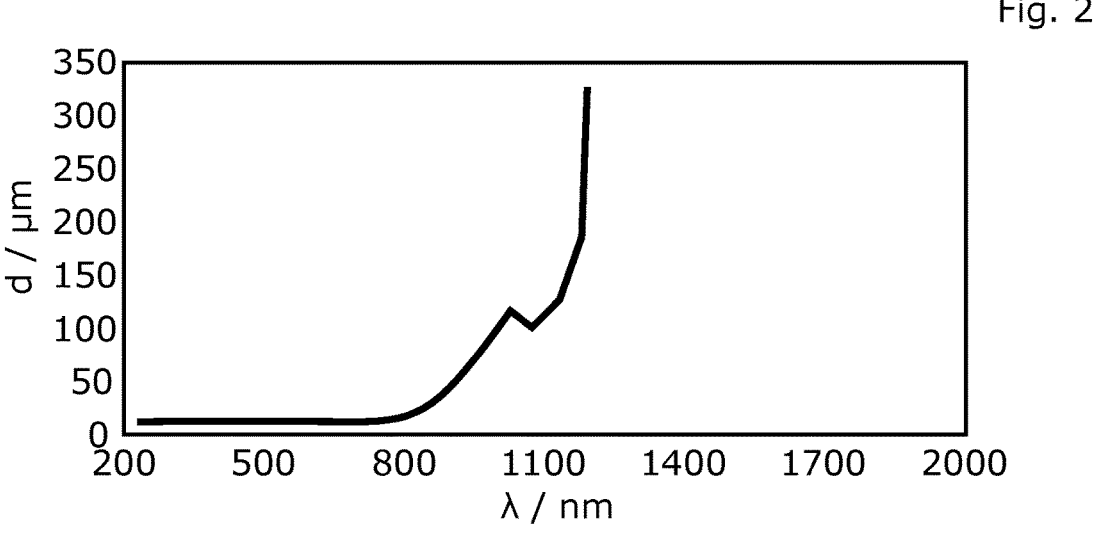
FIG. 2 shows a diagram of penetration depth d in silicon as a function of wavelength k of the electromagnetic radiation used.

FIG. 2 shows a schematic, copied diagram from which penetration depth d in silicon can be read off as a function of wavelength k of the electromagnetic radiation used. The penetration depth in the silicon can be used to optimise the area of the absorption. It can be seen in be diagram that the penetration depth with a used wavelength of less than approx. 900 nm is limited to a few micrometres. A titanium ion-based laser emits for example photons of this wavelength. In the wavelength range between 800 nm and 1100 nm, the penetration depth is still max. 100 μm. Neodymium or ytterbium lasers with λ~1064 nm and λ~1043 nm, for example, could be used for this wavelength range.

Figure 3:
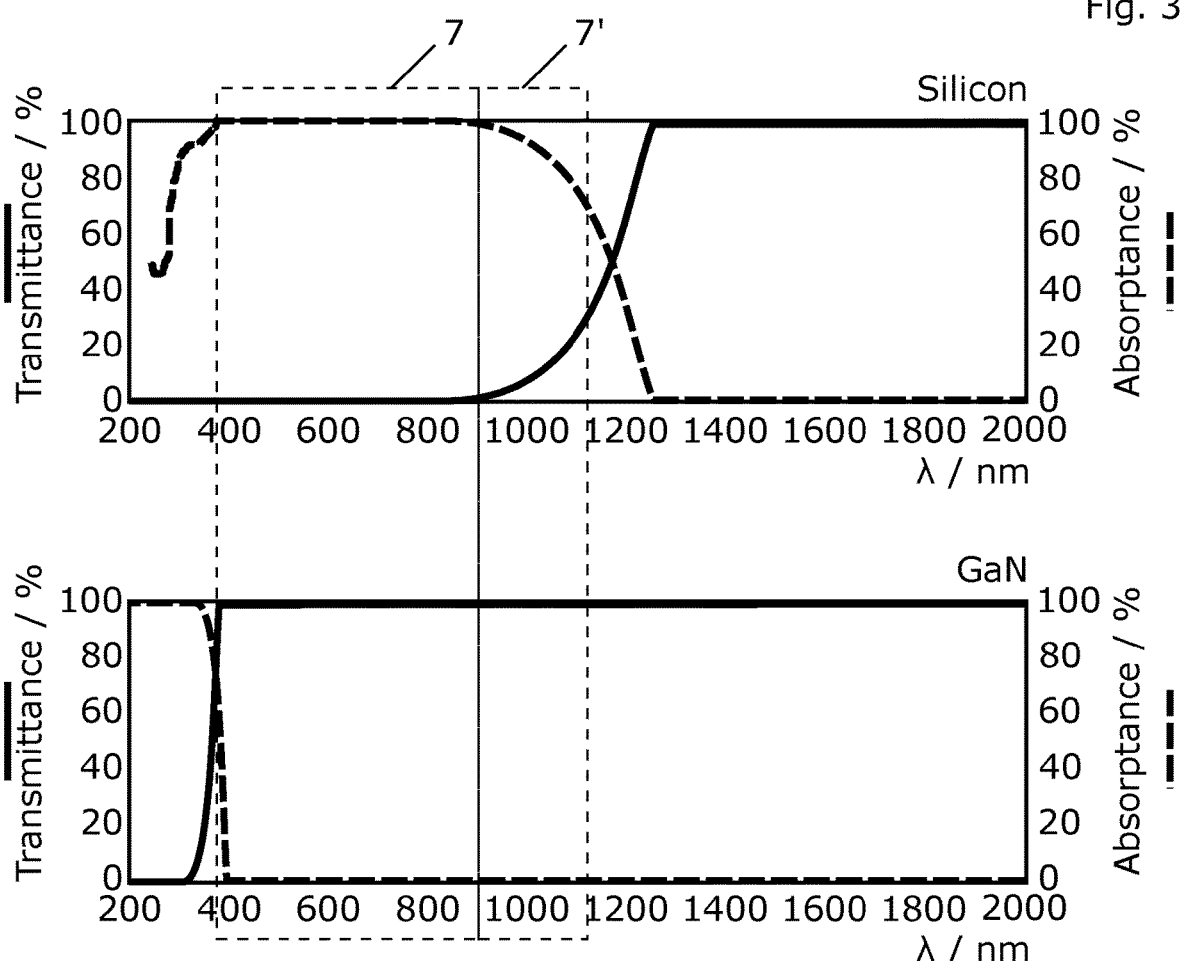
FIG. 3 shows two diagrams in respect of a transmissivity (left-hand ordinate, continuous line) and an absorption (right-hand ordinate, dashed line) as a function of the wavelength for silicon (top) and for GaN (bottom).

FIG. 3 shows two diagrams, one for silicon (top) and one for GaN (bottom). In each diagram, the transmissivity (left-hand ordinate, continuous line) and the absorption (right-hand ordinate, dashed line) are represented as a function of the wavelength. Accordingly, silicon is transparent for electromagnetic radiation with a wavelength of more than approx. 1200 nm, i.e. absorbs as good as no photons. GaN is transparent for electromagnetic radiation with a wavelength of more than approx. 380 nm. The electromagnetic radiation should penetrate the thin layer, in the present case the GaN, but should be absorbed in boundary area 6, in the present case silicon. Accordingly, a transmission window 7 in the wavelength range between approx. 380 nm and 900 nm offers itself for this exemplary combination. If a penetration of the electromagnetic radiation into the silicon is accepted, an extended transmission window 7' up to approx. 1100 nm can be used. The present diagrams thus relate only to exemplary system GaN/Si. For other systems, corresponding diagrams need to be analysed to obtain the optimum transmission window.

LIST OF REFERENCE NUMBERS 1 first substrate (transferring substrate, growth substrate)
1' second substrate (receiving substrate, transfer substrate)
1o' substrate surface
2 thin layer
3 structure
4 coating
5 electromagnetic radiation
6 boundary area, interface
7, 7' transmission window
What is claimed is:

1. A method for separating structures from a substrate, the method comprising:
   i) growing a thin layer on a first substrate;
   ii) forming at least one structure from the thin layer;
   iii) coating the at least one structure;
   iv) contacting a second substrate with the at least one structure, the coating being between the second substrate and the at least one structure;
   v) irradiating of a boundary area between the first substrate and the at least one structure with electromagnetic radiation; and
   vi) separating the at least one structure from the first substrate,
   wherein the electromagnetic radiation first penetrates the at least one structure and then strikes the boundary area.

2. The method according to claim 1, wherein the separation of the at least one structure takes place selectively.

3. The method according to claim 1, wherein the at least one structure has a thickness between 0 μm and 1000 μm.

4. The method according to claim 1, wherein the at least one structure is generated on the first substrate before the separation.

5. The method according to claim 1, wherein, during the irradiation in step v), the electromagnetic radiation is emitted by irradiation means and directed onto the at least one structure.

6. The method according to claim 1, wherein the first substrate is made of silicon.

7. The method according to claim 1, wherein the at least one structure is made of gallium nitride (GaN).

8. The method according to claim 1, wherein a wavelength of the electromagnetic radiation lies between 300 nm and 2000 nm.

9. The method according to claim 1, wherein a transmissivity of the at least one structure for electromagnetic radiation is greater than 10%.

10. The method according to claim 1, wherein a transmissivity of the first substrate for electromagnetic radiation is less than 90%.

11. The method according to claim 1, wherein an intensity of the electromagnetic radiation lies between 100 mWatt and 10 kWatt.

12. A device for separating at least one structure from a first substrate, the at least one structure being in contact with a second substrate, said device comprising:

irradiation means for irradiating, through the second substrate, a boundary area between the first substrate and the at least one structure with electromagnetic radiation; and separation means for separating the at least one structure from the first substrate, wherein the irradiation means are constituted such that the electromagnetic radiation first penetrates the at least one structure and then strikes the boundary area.

13. The method according to claim 1, wherein the second substrate is transparent for electromagnetic radiation and is arranged between an irradiation means and the at least one structure during the irradiating of the boundary area.

14. The method according to claim 1, wherein the at least one structure includes an electronic component.

* * * * *